United States Patent
Woo et al.

[11] Patent Number: 6,017,463
[45] Date of Patent: Jan. 25, 2000

[54] POINT OF USE MIXING FOR LI/PLUG TUNGSTEN POLISHING SLURRY TO IMPROVE EXISTING SLURRY

[75] Inventors: Christy Mei-Chu Woo; Steven C. Avanzino, both of Cupertino; Steven Douglas Bartlett, Livermore, all of Calif.

[73] Assignee: Advanced Micro Devices, Inc., Sunnyvale, Calif.

[21] Appl. No.: 08/976,026

[22] Filed: Nov. 21, 1997

[51] Int. Cl.[7] .............................. H01L 21/00; B44C 1/22
[52] U.S. Cl. ........................ 252/79.1; 156/345; 216/89; 252/79.4; 438/693
[58] Field of Search .................................. 438/691, 692, 438/693; 216/38, 88, 89; 252/79.1, 79.4; 156/345 LP

[56] References Cited

U.S. PATENT DOCUMENTS 5,527,423  6/1996  Neville et al. ........................ 438/693
5,626,715  5/1997  Rostoker .......................... 438/693 X Primary Examiner—William Powell
Attorney, Agent, or Firm—Gerald Fisher

[57] ABSTRACT

An improved tungsten plug/Local Interconnect slurry for Chemical Mechanical Polishing which does not require inclusion of a chemical stabilizer. The slurry is made using a combination of two separate batch mixings of stable ingredients and Point-of Use mixing of portions of the two batches, whereby the oxidizers are combined with the coated abrasive mixture immediately prior to dispensing the slurry onto the polishing pad by combining selected flows from each of the two batches to form a total flow rate equal to the required rate of slurry flow onto the polishing pad.

29 Claims, 3 Drawing Sheets

POINT OF USE MIXING FOR LI/PLUG TUNGSTEN POLISHING SLURRY TO IMPROVE EXISTING SLURRY

FIELD OF THE INVENTION

A polishing slurry composition for planarization of silicon semiconductor wafers by chemical mechanical polishing of the wafer and its method of making. More particularly, a slurry composition and its method of making for polishing a wafer having tungsten lines over titanium or titanium nitride layers, and having tungsten filled vias through silicon dioxide dielectric layers, where the slurry has a high removal rate selectivity for the tungsten and Ti in relation to the silicon dioxide removal rate.

BACKGROUND OF THE INVENTION

Integrated circuit complexity has continued to evolve, placing increasingly more demanding specifications on the processes used in their manufacture. As the requirement for increasing the density of active devices on an individual chip has escalated, the requirement for greater flatness, over long distances and short distances, on the surfaces, top and bottom, of the wafer has also evolved. A flat surface is desirable for several reasons. Flatness is a requirement for cooperation with the optical focusing characteristics of optical stepper devices. As the optical lens requirements for increased resolution have increased, the depth of field of the lens has decreased. Also, attachment of the interconnection metallization to its underlayer is improved if the metal is not required to pass over abrupt underlying steps. In addition, flatness improves ability to fill via holes and lines through apertures in the dielectric.

Various processes have been used for planarization. One such process known as Chemical-Mechanical Polishing (CMP) is presently being used in the most demanding applications. CMP enhances the removal of surface material over large distances and short distances by simultaneously abrading the surface while a chemical etchant selectively attacks the surface. For this purpose, CMP utilizes a polishing slurry containing both an abrasive and a chemically active component.

It is known from the prior CMP efforts that for a particular CMP slurry to be successful it must exhibit significantly different removal rates for at least two different materials on the wafer surface. This is called selectivity and is normally shown as a different polish rate for the metal vis-a-vis the interlayer dielectric.

CMP is becoming a preferred method of polishing tungsten during formation of tungsten interconnects and contact/via plugs. A common use of tungsten metal in an integrated circuit is for contact/via plugs. Generally, for this application, a contact/via hole is etched through a dielectric layer to expose regions of the underlying devices (for first-level metallization) or metal interconnects (for higher levels of metallization). A Ti or TiN glue layer is deposited onto the sides and bottom of the contact/via hole, and tungsten is deposited thereon. CMP is used to remove the deposited tungsten from the wafer surface, leaving tungsten plugs in the contact/via holes having surfaces coplanar with the exposed dielectric. With proper process parameters, CMP tungsten processing has shown significantly improved process windows and defect levels over standard tungsten dry etch back processing for this application. One significant advantage of CMP tungsten processing is that it has a highly selective polish rate for tungsten as compared to the dielectric. This selectivity allows for over-polishing while still achieving a flat tungsten plug surface. When overetching using etch-back technology, the contact or via becomes further recessed which creates a serious disadvantage since overetching is frequently required to remove defects and to ensure complete removal of surface tungsten. The advantage of CMP, however, can be offset by the creation of significant levels of defects during polishing, such as scratches. Accordingly, the success of tungsten CMP processing performance for contact/via plug processing as well as tungsten interconnect processing is linked to improvements in selectivity and defect control.

Another important application of tungsten in integrated circuit manufacturing is for so-called local interconnects (LI), conductive straps between circuit elements in close proximity to one another. One commonly used methodology for local interconnects utilizes the Damascene process. In this process a first metal is inlaid into the lowest dielectric layer, usually termed ILD0. This involves first depositing ILD0, then patterning and etching recessed trenches in the dielectric where the metal lines are to be placed. Contact to the underlying devices is made where the is trenches pass over the active device regions; elsewhere the field oxide insulates the metal from the substrate. Generally, a sandwich structure of Ti, TiN, and tungsten is next deposited into the trenches and onto the dielectric surface. CMP is used to remove the conductive materials from the dielectric surface, leaving metal stripes in the trenches to function as local interconnects. For this application the CMP process must totally remove all conductive residues of tungsten, TiN, and Ti from the dielectric surface in order to prevent shorting between adjacent metal lines. This is because for the Damascene process, the next process step after CMP is the deposition of next level dielectric, which would leave buried shorts if conductive residues remained. In contrast, for contact/via plug technology, the CMP is followed by next level metal deposition, patterning, and etch, wherein conductive residues would be removed from the dielectric surface during metal overetch. As a result, an optimal CMP process for local interconnects must have high polish rate selectivity of TiN and Ti over dielectric, as well as high polish rate selectivity of tungsten over dielectric. Additionally, the tungsten polish rate and Ti or TiN polish rates would ideally be comparable, so as to avoid erosion of the tungsten lines during Ti or TiN overpolish.

For various reasons, prior CMP slurries have not been as effective as needed. Deep or wide scratch defects of the underlying surface by the abrasive have caused problems. Simultaneous high tungsten and Ti polish rates have only been achieved at the expense of high selectivity to oxide polish rate. Also, since a large volume of CMP slurry is required, the development of a low-cost chemical composition with acceptable shelf life and chemical stability is essential.

A slurry satisfying the aforementioned goals was developed, and is described in U.S. patent application Ser. No. 08/829,704, filed Mar. 26, 1997, U.S. Pat. No. 5,916, 855, entitled "Chemical-Mechanical Polishing Slurry Formulation and Method for Tungsten and Titanium Thin Films" by Steven Avanzino et al, which is hereby incorporated by reference. This slurry contains ammonium chloride which acts as a stabilizer and prevents degradation of the slurry with time. Unfortunately, after using the slurry of the Ser. No. 08/829,704 Avanzino et al application, it was noted that certain metal portions of the polisher exposed to the slurry became corroded after a long period of heavy use. For example, the exposed edge of the polish platen can corrode and chip, thereby causing possible defects on the wafers.

The wafer carrier can also corrode due to splashing of the slurry. This corrosion problem can be partially alleviated by either protecting the metal from exposure to the slurry, for example by covering the polishing platen with an oversized polishing pad, or by utilizing corrosion resistant materials for the exposed portions. Coating the carrier with a corrosion resistant material, or using certain corrosion resistant grades of stainless steel, are among the options.

It was discovered that the corrosion problem was due to the inclusion in the Avanzino et al slurry of ammonium chloride. Formulating an effective Local Interconnect (LI)/tungsten slurry which did not require inclusion of the ammonium chloride stabilizer and thereby did not induce corrosion was needed.

SUMMARY OF THE INVENTION

It is therefore an object of this invention to provide a practical tungsten CMP slurry having excellent selectivity of tungsten polish rate over dielectric polish rate, which enables removal of surface tungsten from a silicon integrated circuit wafer, resulting in a substantially planar surface, with a low defect count and excellent uniformity, without causing corrosion of the polisher.

It is a further object of this invention to provide a practical tungsten CMP is slurry having excellent selectivity of TiN and Ti polish rate over dielectric polish rate, which enables use of the slurry in CMP processing for local interconnect applications, without causing corrosion of the polisher.

It is a further object of this invention to provide a method of making and using the CMP slurry which avoids slurry degradation, without inclusion of a corrosive chemical stabilizer, and without causing corrosion of the polisher.

These objects are achieved by: 1) formulating the slurry from abrasive particles coated with an organic acid salt such as ammonium hydrogen phthalate, the particles having a sufficiently small median diameter and a very tight diameter variation, and by thoroughly premixing the abrasive particles with a suspension agent before combining with the oxidizer(s), and 2) thereafter utilizing Point-of Use mixing to combine the premixed abrasive particles and suspension agent with a ferric salt oxidizer, ferric nitrate by way of example, and a Ti oxidizing agent, ammonium persulfate by way of example, immediately prior to dispensing the slurry onto the polishing pad.

DETAILED DESCRIPTION OF THE INVENTION

Figure 1:
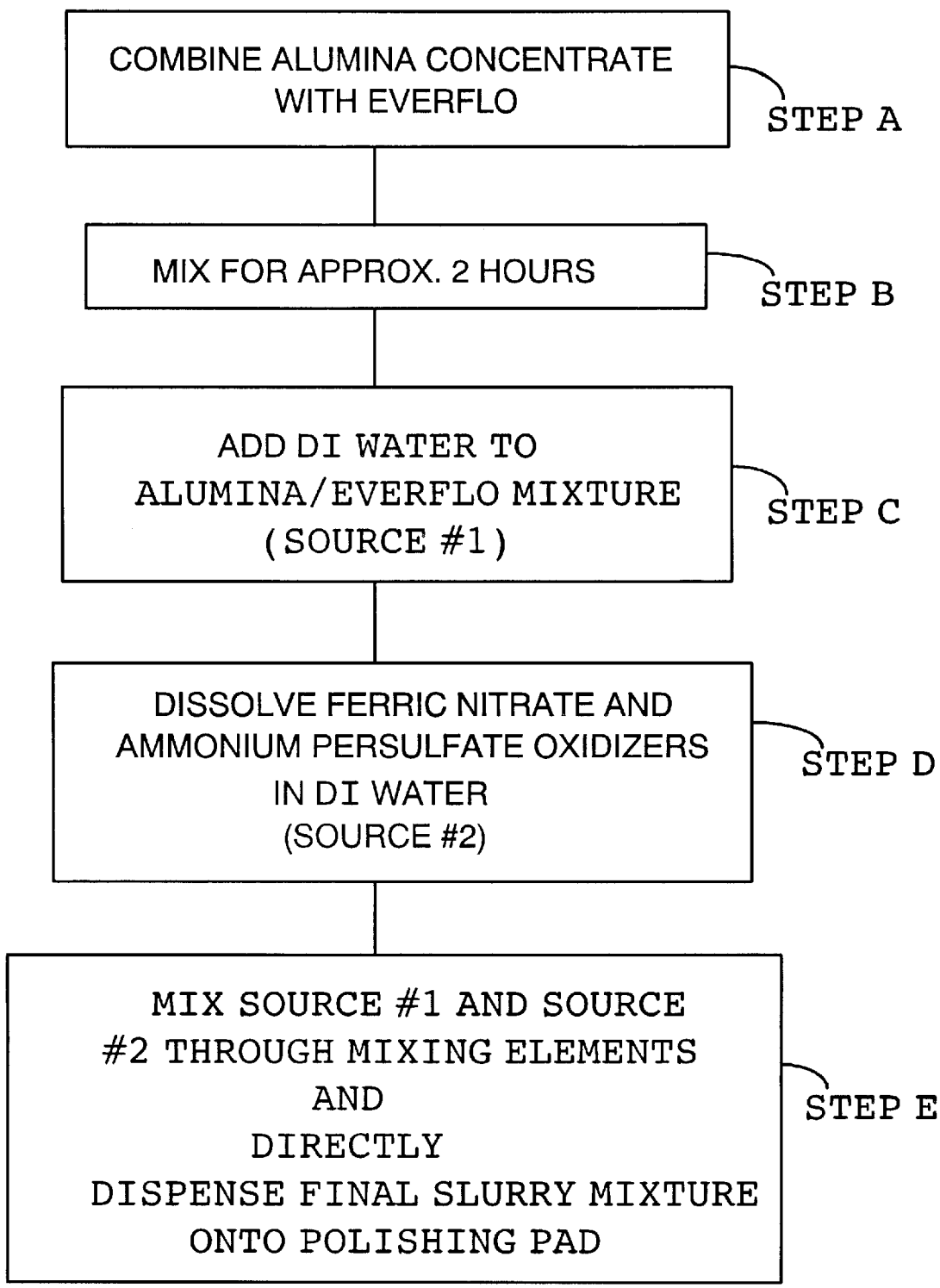
FIG. 1 shows the process flow for the making of the inventive slurry.

The LI/Tungsten plug slurry of the above cited Avanzino et al application (incorporated by reference) utilizes an alumina abrasive suspension wherein the is alumina particles are coated with an organic acid salt, ammonium hydrogen phthalate, $(NH_4)HC_6H_4(CO_2)_2$. To achieve optimal polishing results, prior to mixing with the oxidizers, the alumina particles were coated with a suspension agent, EVERFLO, (comprising mostly water, about 12½ wt % stearic acid, about 12½ wt % vegetable oil, and small amounts of methyl paraben and propylene glycol), according to a specific method. EVERFLO was added to alumina concentrate and mixed by a magnetically driven stirrer for 2 hours, then the diluted oxidizer(s) were added to make up the final batch volume. The batch mixing method was used, whereby all components were mixed together in one pot, where they remained over a period of hours or days before using. Two different slurries were described: a tungsten plug slurry utilizing ferric nitrate oxidizer alone, and a local interconnect (LI) slurry utilizing both ferric nitrate and ammonium persulfate oxidizers. The addition of the ammonium persulfate enhanced the titanium removal rate, a necessity for LI applications.

In the above cited Avanzino et al application, it was reported that ammonium chloride ($NH_4Cl$) was added to the ferric nitrate/persulfate slurry to stabilize the slurry and prevent unwanted chemical reactions from decomposing the mixed ingredients during storage. Chemical instability of the slurry was evidenced by discoloration observed over a period of hours after first mixing. The literature suggests that many organic free-radical polymerization reactions can be initiated with persulfate compounds, or with so-called "redox" initiators such as persulfate-ferrous solutions. This suggested the likelihood that the desired $Fe^{3+}/S_2O_8^{2-}$ oxidizer combination for the LI slurry caused incompatibility problems with the dissolved phthalate species. The tungsten slurry containing ferric nitrate oxidizer only did not evidence slurry discoloration or decomposition.

Chloride compounds act to inhibit or retard free-radical type reactions, even though initiators such as $Fe^{3+}/S_2O_8^{2-}$ are present. It was experimentally observed that the degree of LI slurry decomposition, as evidenced by the extent of discoloration, was inversely related to the concentration of ammonium chloride used. Although 0.7 wt % ammonium chloride resulted in very minimal decomposition, the discoloration continued to decrease when higher concentrations of $Cl^-$ were used, and no discoloration was seen at 2 wt % ammonium chloride. The final best mode LI slurry utilized 2 wt % ammonium chloride.

Unfortunately, it has now been discovered that the presence of the chloride ions in the LI slurry is responsible for the long-term corrosion of the metallic parts of the polish tool and the wafer carriers.

A new method of making the slurry employing Point-of Use mixing as described hereinafter has provided an improved method for using a slurry not including the corrosive ammonium chloride, for tungsten and LI Chemical Mechanical Polish.

A method for Point-of Use mixing of CMP slurry to overcome setting and gelling is known. In the prior art, all the various slurry components are maintained in a separate batch which is mixed continuously, and are withdrawn for deposition onto the polish platen.

Our inventive slurry formulation and method employs a Point-of Use mixing method which does not batch mix all the ingredients in a single mixing chamber, but instead provides two separate premixed batches and combines small flows from the two separate batches which are combined as part of the flow onto the wafer. The implementation of this method keeps the active ingredients separate until they are flowing to the wafer. Although our slurry preparation method includes a batch pre-mixing of the alumina concentrate with the EVERFLO substantially before the final Point-of Use mixing, this combination does not degrade over time.

FIG. 1 shows a preferred embodiment of the process flow for the making of the inventive slurry. In step A, alumina concentrate is combined with EVERFLO. In step B, the alumina/EVERFLO combination is mixed by a magnetically driven stirrer for approximately 2 hours. In step C, DI water is added to the alumina/EVERFLO mixture. This diluted mixture forms source #1. In step D ferric nitrate and ammonium persulfate oxidizers are dissolved in DI water. This solution forms source #2. Step D may be performed far in advance of slurry use, in batch mode. In step E a small flow of the mixture of source #1 and a small flow of the solution of source #2 are mixed through mixing elements, and the final slurry mixture is immediately dispensed onto the polishing pad.

Figure 2:
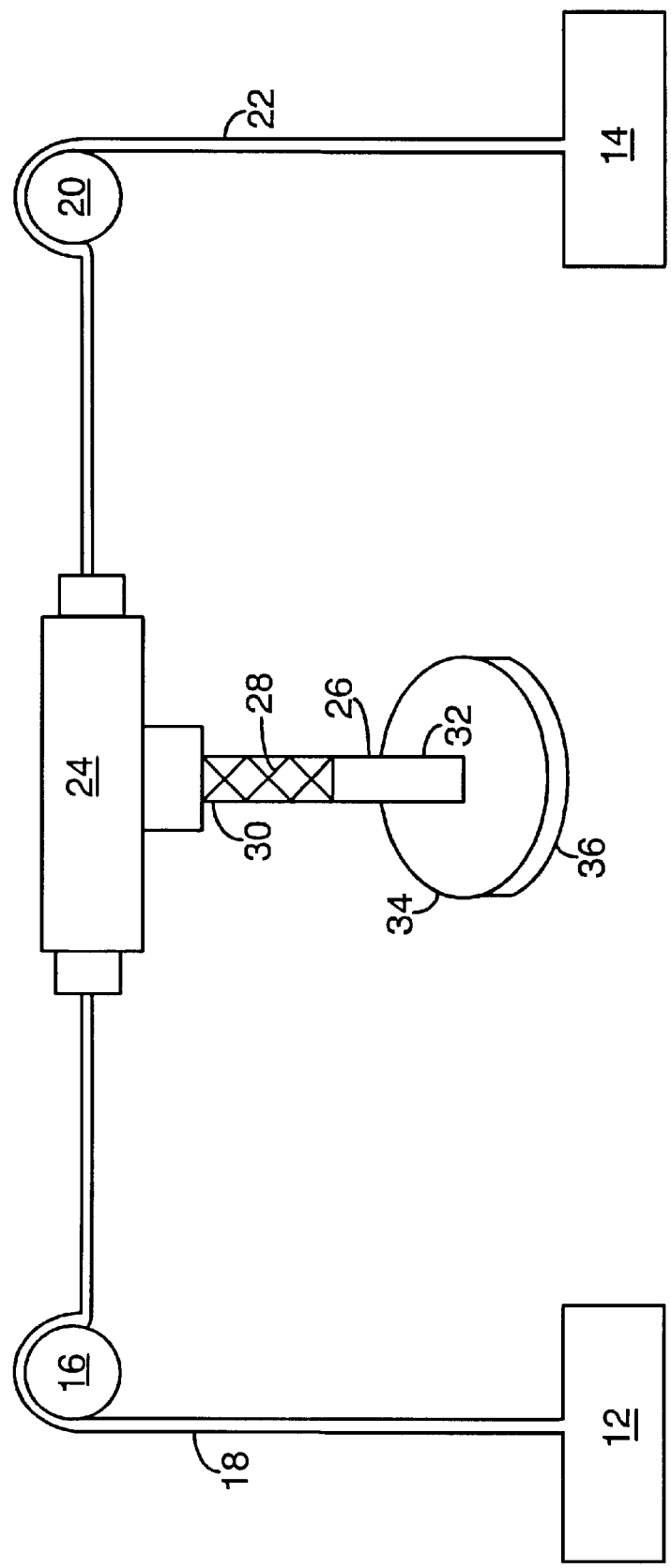
FIG. 2 depicts the Point-of Use mixing set-up for the making of the preferred inventive slurry.

FIG. 2 depicts the Point-of Use mixing set-up for the preferred embodiment described above. A similar set-up was used for Experiment #1 described hereinafter, except that in Experiment #1, the ferric nitrate oxidizer was included in source container #1 rather than source container #2. FIG. 2 shows source container #1 (12) containing the batch pre-mixture of alumina concentrate and EVERFLO, diluted with DI water. Source container #2 (14) contains the ferric nitrate/ammonium persulfate oxidizers dissolved in DI water. Peristaltic pump #1 (16) pumps the mixture from source #1 (12) through feed tube 18. Peristaltic pump #2 (20) pumps the solution from source #2 (14) through feed tube 22. Feed tubes 18 and 22 have ¼ inch diameters. The flows from the two feed tubes 18 and 22 are combined by "T" element 24 and are then output through dispensing tube 26, which has ⅜ inch diameter. Dispensing tube 26 has static flow mixing elements 28 inserted therein, at end 30 of tube 26 adjacent to T element 24. Static mixers consist of fixed, in-line baffles which cause the mixing fluids to shear and swirl, clockwise and counterclockwise, separating and combining, to provide a homogeneous output. The mixer elements used for the experiments described herein were Omega FMX 8125-P, made from polypropylene. Each mixing block is 4 inches long and contains 16 elements. 1½ mixing blocks were used which appeared to provide sufficient mixing. Slurry is dispensed through end 32 of tube 26 onto polishing pad 34 mounted on polish platen 36.

Experiments performed

In a first experiment, Experiment #1, source container #1 (12) contained not only the alumina concentrate/EVERFLO mixture, but also the ferric nitrate oxidizer. Source #1 contained a slurry mixture similar to the tungsten plug slurry described in U.S. patent application Ser. No. 08/829,704, which has been incorporated by reference. Source container #2 (14) contained the diluted ammonium persulfate oxidizer only. The exact composition of each source is listed in Table 1.

TABLE 1

Compositions of two sources in experiment #1

| Source #1 | Source #2 |
| --- | --- |
| 25 vol % XJFB1505B alumina | 10 wt % ammonium persulfate: |
| 18.75 vol % EVERFLO | 420.66 grams ammonium |
| 2.5 wt % ferric nitrate | persulfate per gallon DI water |
| 56.25 vol % DI water | |

In this experiment, the flows from the sources were adjusted to provide 80% of the final slurry coming from source #1 and 20% of the final slurry coming from source #2. Total slurry flow was 300 ml/min with 240 ml/minute from source #1 and 60 ml/min from source #2.

The polishing sequence using new Suba 500 and Politex pads on a Strasbaugh 6DS-SP polisher included:
A. Pad qualification:

1. Burn in with tungsten dummy wafers, 300 seconds per cycle for two cycles;
2. Tungsten removal rate test at 50 second polish;
3. Defect tests: defect monitors were 2500 A PETEOS, polished for 60 seconds B. Test sequence was performed eight times to obtain a total of nine data points for tungsten removal. Titanium removal rate was measured at cycles #13 and #74. Oxide defect monitoring was performed during pad qualification and at the end of the polish sequence.

ten cycles of oxide dummies polished for 60 seconds per cycle one cycle of tungsten dummies polished for 300 seconds per cycle one cycle of tungsten removal rate monitor polished for 50 seconds per cycle. The removal rate monitor was loaded alternately on each spindle and a tungsten dummy was loaded on the other spindle.

Figure 3:
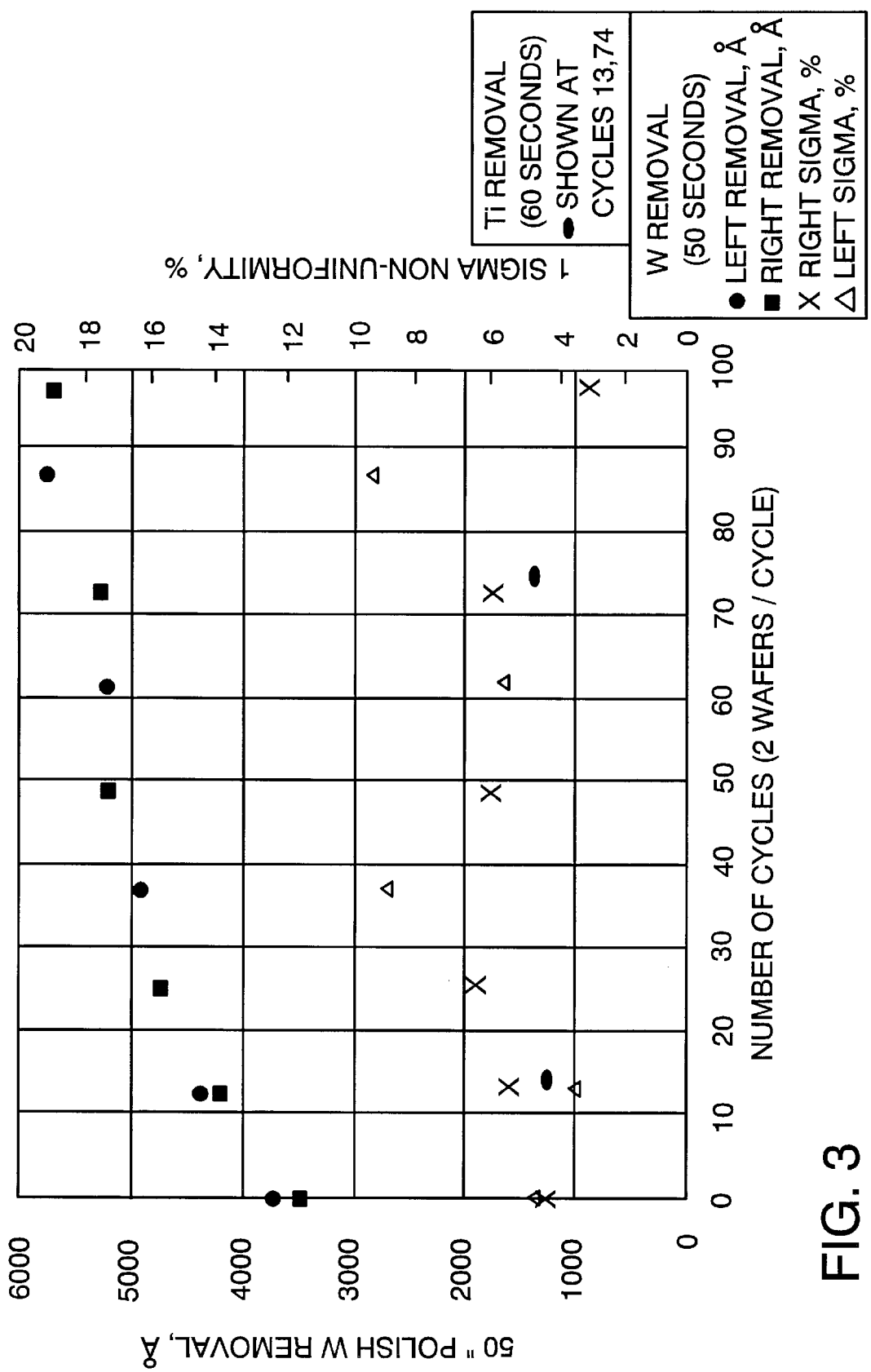
FIG. 3 is a graph of the tungsten and titanium removal rates for an experimental Point-of Use mixed tungsten/titanium slurry.

The experimental tungsten and titanium removal rate results for Experiment #1, as well as the tungsten Within-Wafer Non-Uniformity (WIWNU), are shown in FIG. 3. In these regards, the Point-of Use (POU) slurry performed similarly to the batch mixed slurry described in the earlier incorporated patent application. The POU slurry is darker in color and has a 10% lower initial tungsten removal rate. Both mixing modes show a steady increase in tungsten and titanium removal rates over the life of the polish pad. When POU mixing was employed, no darkening in color was seen on the pad after polishing of 200 wafers, indicating acceptable short term stability for manufacturing use.

Oxide defect monitors from before and after 100 polish cycles using POU slurry showed a marked increase in microscratches over the course of the pad life. Both sets of defect monitors showed higher defect density than was seen with batch mixing. Whereas the batch mixed slurry showed defect levels much lower than the process spec limit of 800, the Point -of Use slurry showed defect counts of 978–1253 at the beginning of the polish cycle, and 1361–1524 at the end of the polish cycle.

In a second experiment, Experiment #2, Source #1 (12) contained the diluted alumina concentrate/EVERFLO mixture only, and Source #2 (14) contained both the ferric nitrate and ammonium persulfate oxidizers. The exact contents of each source are listed in Table 2.

TABLE 2

Contents of two sources in experiment #2

| Source #1 | Source #2 |
| --- | --- |
| 1 gallon XJFB1505B alumina | 432 grams ammonium persulfate |
| 0.75 gallons EVERFLO | 407 grams ferric nitrate |
| 0.75 gallons DI water | 2.5 gallons DI water |

Source #1 and source #2 were mixed in a 1:1 volume ratio through the mixing elements with the same 300 cc/min total slurry flow as was used in the first experiment. The polish sequence using new Suba 500 and Politex pads on a Strasbaugh 6DS-SP polisher included:
1. Burn in with tungsten dummy wafers, 300 seconds per cycle for two cycles;
2. Tungsten removal rate test at 50 second polish;
3. Defect tests: oxide defect monitors were 2500 A PETEOS, polished for 60 seconds;
4. Ti removal rate test at 60 second polish time.

Experimental results from Experiment #2 showed the tungsten and Ti removal rates to be similar to those shown in Experiment #1, with 3068 Angstroms tungsten removal in 50 seconds, and a Ti removal rate of 1037 Angstroms/minute. A large improvement in defectivity level over the mixing method of Experiment #1 was seen. The oxide defect monitor PC Inspex counts (proportional to micro-scratch density) were:

WPOL recipe (measuring both shallow and deep microscratches and pits)=373 (spec is below 800)

USCR0CG recipe (measuring deep scratches and pits only)=126

PC counts of 0.5 micron and above=11 (spec is below 30) A microscope inspection showed the general background to be clean, with some shallow scratches and few divots.

The preferred embodiment of this invention as described by Experiment #2 provides for POU flow mixing of the required quantity of ammonium persulfate and ferric nitrate oxidizers into the appropriate flow of a previously batch mixed alumina/EVERFLO mixture. Using this embodiment, tungsten and titanium removal rates, as well as defect levels, are within the specifications of the prior batch process, with the advantage of the substantial elimination of slurry-induced corrosion of the polisher materials. It is anticipated that acceptable results will be obtained over a range of final slurry composition as follows:

10–40 vol % alumina concentrate
(corresponding to 0.5–2 wt % ammonium hydrogen phthalate)
10–30 vol % EVERFLO
1–5 wt % ferric nitrate
1–5 wt % ammonium persulfate
30–80 vol % DI water Our invention provides for a novel combination of prior batch mixing of parts of the final slurry and point of use flow mixing of the needed amount of final slurry as it is applied, in order to maintain the favorable tungsten and Ti removal rate characteristics and low defect densities of the tungsten/Ti slurry described in the earlier incorporated patent application, while avoiding slurry instability and degradation, and without including a corrosive chemical stabilizer causing equipment degradation. The use of point-of-use flow mixing allows the slurry to be formulated without the aluminum chloride stabilizer, which causes corrosion of the polish apparatus. Another advantage of our invention is that it is easily incorporated into the existing process flow, since the flow mixer element can be easily inserted inside a regular slurry dispense line. Use of the improved slurry reduces cost in several ways. First, the slurry itself (a major consumable) is lower in cost since it contains one less component. Secondly, the exclusion of the chemical causing corrosion will extend the lifetime of the metal portions of the CMP tools exposed to the slurry, and thereby lower maintenance downtime as well as replacement costs. These cost savings far outweigh the minimal cost of providing a second pump and feed line. Wafer defects caused by the corroded polisher particles which land on the polish pad are also substantially eliminated by using our inventive slurry and method.

It is not intended that the invention be restricted to the exact embodiments described. For example, the details of the slurry delivery apparatus such as the pumps or mixing elements could be changed without altering the inventive concept. The exact composition of the slurry could also vary, for example by utilizing the alternate oxidizing agents, suspension agents, abrasive particles, or solubility coatings disclosed in the incorporated patent application Ser. No. 08/829,704. The scope of the invention should be construed in view of the claims.

With this in mind, we claim:

1. A method for making a chemical-mechanical polishing (CMP) slurry comprising the steps of:

providing abrasive particles in an aqueous concentrate having a median particle diameter less than 0.400 microns, said abrasive particles having a solubility coating thereon;

blending said abrasive particles in said aqueous concentrate with a suspension agent;

then mixing a first component of water with said blended abrasive particles to form an intermediate slurry;

combining further ingredients including a ferric oxidizer, a titanium oxidizing agent and a second component of water into said intermediate slurry by flowing together all said further ingredients and said intermediate slurry to form a final slurry flow; and dispensing all said final slurry flow onto a polishing pad in a continuous flow as fast as said final slurry is formed.

2. The method of claim 1 wherein all said further ingredients are substantially non-corrosive of Fe based materials.

3. The method of claim 2 wherein said abrasive particles are $Al_2O_3$.

4. The method of claim 3 wherein said solubility coating is ammonium hydrogen phthalate.

5. The method of claim 4 wherein said suspension agent is EVERFLO, comprising mostly water, about 12½ wt % stearic acid, about 12½ wt % vegetable oil, and small amounts of methyl paraben and propylene glycol.

6. The method of claim 5 wherein said titanium oxidizing agent is ammonium persulfate.

7. The method of claim 6 wherein said ferric salt oxidizer is $Fe(NO_3)_3 9H_2O$.

8. The method of claim 7 wherein the median diameter of the abrasive particles is in the range between 0.170 microns and 0.270 microns.

9. The method of claim 2 wherein said step of blending said abrasive particles includes physically vigorously mixing said particles in said aqueous concentrate with said suspension agent for a time on the order of two hours before addition of said first component of water.

10. The method of claim 2 wherein said step of combining further ingredients including a ferric salt oxidizer and a titanium oxidizing agent into said intermediate slurry to form a final slurry by flowing together all said further ingredients and said intermediate slurry to form a final slurry flow comprises:

flowing a first flow from a first source containing said intermediate slurry through a first feed tube, said first flow having a first flow rate;

flowing a second flow from a second source containing said ferric salt oxidizer, said titanium oxidizing agent, and said second component of water through a second feed tube, said second flow having a second flow rate;

combining said second flow and said first flow of said intermediate slurry, to form a third flow of said final slurry, and distributing said final slurry to said polisher pad by flowing all said third flow of said final slurry through a dispensing tube having a mixing element therein.

11. The method of claim 10 wherein all said further ingredients are substantially non-corrosive of Fe based materials.

12. The method of claim 7, wherein said final slurry comprises:
- 10–40 vol % alumina concentrate;
- 10–30 vol % EVERFLO, comprising mostly water, about 12½ wt % stearic acid, about 12½ wt % vegetable oil, and small amounts of methyl paraben and propylene glycol;
- 0.5–2 wt % ammonium hydrogen phthalate;
- 1–5 wt % ferric nitrate;
- 1–5 wt % ammonium persulfate;
- 30–80 vol % DI water.

13. The method of claim 12, wherein said final slurry comprises:
- 20 vol % alumina concentrate;
- 15 vol % EVERFLO, comprising mostly water, about 12½ wt % stearic acid, about 12½ wt % vegetable oil, and small amounts of methyl paraben and propylene glycol;
- 1.01 wt % ammonium hydrogen phthalate;
- 2.1 wt % ferric nitrate;
- 2.2 wt % ammonium persulfate;
- 65 vol % DI water.

14. The method of claim 10, wherein said first source contains:
- 20–80 vol % alumina concentrate;
- 20–60 vol % EVERFLO, comprising mostly water, about 12½ wt % stearic acid, about 12½ wt % vegetable oil, and small amounts of methyl paraben and propylene glycol;
- 1–4 wt % ammonium hydrogen phthalate;
- 0–60 vol % DI water;

said second source contains
- 2–10 wt % ferric nitrate;
- 2–10 wt % ammonium persulfate;
- 100 vol % DI water;

said first flow is 50% of said third flow, and said second flow is 50% of said third flow.

15. The method of claim 14, wherein said first source contains:
- 40 vol % alumina concentrate;
- 30 vol % EVERFLO, comprising mostly water, about 12½ wt % stearic acid, about 12½ wt % vegetable oil, and small amounts of methyl paraben and propylene glycol;
- 2.02 wt % ammonium hydrogen phthalate;
- 30 vol % DI water;

said second source contains
- 4.2 wt % ferric nitrate;
- 4.4 wt % ammonium persulfate.

16. In a process for making a Chemical Mechanical Polishing slurry for delivery to a wafer/pad interface of a polishing machine, said slurry including abrasive particles in an aqueous concentrate having a median particle diameter less than 0.40 microns, said abrasive particles having a solubility coating thereon and further being blended with a suspension agent and mixed with DI water to form a first component of said slurry, a second component of said slurry comprising a ferric salt oxidizer and a titanium oxidizing agent, THE IMPROVEMENT COMPRISING:

a) selecting a first rate of flow of said first component and a second rate of flow of said second component;

b) mixing said first component and said second component together to form said slurry, said slurry having a third rate of flow which is the sum of said first rate of flow and said second rate of flow of said second component; and c) delivering said slurry to said polishing machine wafer/pad interface at said third rate of flow.

17. The process of claim 16, wherein said first component and said second component of said slurry are substantially non-corrosive of Fe based materials.

18. An intermediate CMP slurry product comprising a first container holding a first mixture and a second container holding a second mixture, said first mixture comprising an aqueous suspension which is a combination of abrasive particles having a median diameter less than 0.40 microns, a suspension agent, and water;

said second mixture comprising a ferric oxidizer, a titanium oxidizing agent, and water;

said first container and said second container being adapted to be connected to provide respectively a flow into a first and a second input arm of a T connector, whereby the output arm of said T connector would provide the sum flow rate of the flow rates from said first and said second container.

19. The intermediate CMP slurry product of claim 18, wherein said first mixture and said second mixture are substantially non-corrosive of Fe based materials.

20. A Chemical Mechanical Polishing (CMP) slurry made by the method of claim 1.

21. A Chemical Mechanical Polishing (CMP) slurry made by the method of claim 2.

22. A Chemical Mechanical Polishing (CMP) slurry made by the method of claim 7.

23. A Chemical Mechanical Polishing (CMP) slurry made by the method of claim 9.

24. A Chemical Mechanical Polishing (CMP) slurry made by the method of claim 10.

25. A Chemical Mechanical Polishing (CMP) slurry made by the method of claim 11.

26. A Chemical Mechanical Polishing (CMP) slurry made by the method of claim 13.

27. A Chemical Mechanical Polishing (CMP) slurry made by the method of claim 15.

28. A Chemical Mechanical Polishing (CMP) slurry made by the method of claim 16.

29. A Chemical Mechanical Polishing (CMP) slurry made by the method of claim 17.

* * * * *